US012696428B2

(12) United States Patent
Ji et al.

(10) Patent No.: US 12,696,428 B2
(45) Date of Patent: Jul. 28, 2026

(54) LIQUID COOLING DEVICE AND SERVER

(71) Applicants: Inventec (Pudong) Technology Corporation, Shanghai (CN); INVENTEC CORPORATION, Taipei (TW)

(72) Inventors: Jiaqing Ji, Shanghai (CN); Jingnan Zhao, Shanghai (CN); Boheng Zeng, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 253 days.

(21) Appl. No.: 18/748,155

(22) Filed: Jun. 20, 2024

(65) Prior Publication Data

US 2025/0358975 A1 Nov. 20, 2025

(30) Foreign Application Priority Data

May 14, 2024 (CN) .......................... 202410599421.4

(51) Int. Cl.
| | |
|---|---|
| *H05K 7/20* | (2006.01) |
| *H05K 1/02* | (2006.01) |
| *H05K 1/14* | (2006.01) |

(52) U.S. Cl.
CPC ....... *H05K 7/20772* (2013.01); *H05K 1/0203* (2013.01); *H05K 1/144* (2013.01); *H05K 7/20272* (2013.01); *H05K 2201/042* (2013.01); *H05K 2201/064* (2013.01)

(58) Field of Classification Search
CPC ........... H05K 7/20254; H05K 7/20636; H05K 7/20645; H05K 7/20772; H05K 7/20781; H05K 1/144
See application file for complete search history.

(56) References Cited

U.S. PATENT DOCUMENTS

| | | | | |
|---|---|---|---|---|
| 5,920,457 A * | 7/1999 | Lamb | .................... | H10W 40/47 |
| | | | | 257/E23.098 |
| 6,016,251 A * | 1/2000 | Koide | ................... | H10W 40/47 |
| | | | | 361/720 |
| 7,380,409 B2 * | 6/2008 | Campbell | .......... | H05K 7/20772 |
| | | | | 165/80.4 |
| 7,420,808 B2 * | 9/2008 | Campbell | .......... | H05K 7/20772 |
| | | | | 165/80.4 |
| 7,428,151 B2 * | 9/2008 | Sonnabend | ............... | G06F 1/20 |
| | | | | 361/698 |
| 7,518,871 B2 * | 4/2009 | Campbell | ................. | G06F 1/20 |
| | | | | 165/80.4 |
| 7,593,227 B2 * | 9/2009 | Campbell | .......... | H05K 7/20772 |
| | | | | 361/699 |
| 7,614,247 B2 * | 11/2009 | Nicolai | .............. | H05K 7/20772 |
| | | | | 361/698 |

(Continued)

*Primary Examiner* — Robert J Hoffberg

(57) ABSTRACT

A liquid cooling device and a server are provided. The liquid cooling device includes at least two motherboards provided in a stack, and each motherboard being provided with at least two heat generating elements; and a plurality of liquid cooling plates attached to the plurality of heat generating elements in a one-to-one correspondence. Two liquid cooling plates corresponding to two heat generating elements on the same motherboard are connected in series form a liquid cooling loop, and a plurality of liquid cooling loops are connected in parallel.

12 Claims, 3 Drawing Sheets

(56)                References Cited

U.S. PATENT DOCUMENTS

| | | | |
|---|---|---|---|
| 7,641,101 B2 * | 1/2010 | Campbell | H05K 7/20772 |
| | | | 228/183 |
| 7,751,918 B2 * | 7/2010 | Campbell | H05K 7/20809 |
| | | | 361/676 |
| 7,757,506 B2 * | 7/2010 | Ellsworth, Jr. | H05K 7/20772 |
| | | | 62/332 |
| 8,081,463 B2 * | 12/2011 | Chiu-Mao | H05K 7/20218 |
| | | | 174/15.1 |
| 8,387,249 B2 * | 3/2013 | Campbell | H05K 7/20781 |
| | | | 29/890.03 |
| 8,422,231 B2 * | 4/2013 | Huang | H05K 7/20218 |
| | | | 361/709 |
| 8,644,021 B2 * | 2/2014 | Chen | H05K 7/20809 |
| | | | 361/689 |
| 8,749,968 B1 * | 6/2014 | Branton | H05K 7/20781 |
| | | | 361/698 |
| 9,357,674 B2 * | 5/2016 | Campbell | H05K 7/2039 |
| 10,188,016 B2 * | 1/2019 | Lunsman | H05K 7/20263 |
| 10,201,115 B2 * | 2/2019 | Johnson | H05K 7/20772 |
| 10,237,999 B2 * | 3/2019 | Lunsman | H05K 7/1489 |
| 10,477,725 B2 * | 11/2019 | Chen | F28F 21/082 |
| 10,765,032 B2 * | 9/2020 | Lunsman | H05K 7/20263 |
| 10,827,649 B2 * | 11/2020 | Lunsman | H05K 7/20927 |
| 10,939,583 B2 * | 3/2021 | Kanai | H05K 7/20272 |
| 11,019,752 B2 * | 5/2021 | Gao | H05K 7/20781 |
| 11,452,237 B2 * | 9/2022 | Tan | H05K 7/20272 |
| 11,497,145 B2 * | 11/2022 | Lee | H05K 7/20763 |
| 11,589,482 B2 * | 2/2023 | Gao | H05K 7/20781 |
| 11,770,914 B2 * | 9/2023 | Adam | H05K 7/20509 |
| | | | 361/699 |
| 11,882,671 B2 * | 1/2024 | Chiu | H05K 7/20772 |
| 12,082,368 B2 * | 9/2024 | Adam | H05K 7/20254 |
| 12,089,367 B2 * | 9/2024 | Wu | H05K 7/20772 |
| 12,295,123 B2 * | 5/2025 | Wu | H05K 7/20 |
| 12,317,448 B2 * | 5/2025 | Wu | H05K 7/20 |
| 2005/0128705 A1 * | 6/2005 | Chu | H10W 40/47 |
| | | | 361/689 |
| 2015/0055301 A1 * | 2/2015 | So | G06F 1/20 |
| | | | 361/701 |
| 2018/0066663 A1 * | 3/2018 | Kulkarni | H05K 7/20172 |
| 2024/0365507 A1 * | 10/2024 | Li | H05K 7/20927 |
| 2025/0120048 A1 * | 4/2025 | Xiao | H05K 7/20327 |
| 2025/0358957 A1 * | 11/2025 | Ji | H05K 7/20272 |

* cited by examiner

LIQUID COOLING DEVICE AND SERVER

CROSS-REFERENCE TO RELATED APPLICATIONS

This application claims priority of Chinese Patent Application No. 202410599421.4, filed on May 14, 2024, entitled "LIQUID COOLING DEVICE AND SERVER", the entire content of which is incorporated herein in its entirety.

TECHNICAL FIELD

The present disclosure relates to servers, and in particular to a liquid cooling device and a server.

BACKGROUND

With the rapid development of cloud computing, big data and artificial intelligence and the rise of cloud computing, the demand for computing power in data processing centers is growing rapidly. Since a single processor is difficult to meet the rapidly rising demand for computing power, the use of multiple processors in series and parallel has become one of the common ways to improve the overall computing performance, such parallel processing manner can make full use of the computing power of multiple processors to achieve more efficient data processing.

However, as one of main heat generating elements of the server, the processor generates a lot of heat during operation, and the continuous high temperature will affect the performance of the processor, and even cause damage to the processor. Therefore, how to effectively dissipate heat from a plurality of heat generating elements at the same time becomes a problem that needs to be solved urgently.

SUMMARY

Accordingly, a liquid cooling device and a server are provided.

According to a first aspect, a liquid cooling device is provided, including at least two motherboards that are stacked, and each motherboard being provided with at least two heat generating elements; and a plurality of liquid cooling plates attached to the plurality of heat generating elements in a one-to-one correspondence. Two liquid cooling plates corresponding to two heat generating elements on the same motherboard are connected in series form a liquid cooling loop, and a plurality of liquid cooling loops are connected in parallel.

According to the aforementioned liquid cooling device, at least two motherboards are stacked, at least two heat generating elements are provided on each motherboard, the plurality of liquid cooling plates are attached to the plurality of heat generating elements in a one-to-one correspondence, and two liquid cooling plates corresponding to two heat generating elements on the same motherboard are connected in series to form the liquid cooling loop. Therefore, when coolant is supplied into the liquid cooling loop, the coolant flowing in the liquid cooling plate can dissipate heat from the corresponding heat generating element in time, so that the liquid cooling device can effectively dissipate heat from the plurality of heat generating elements at the same time, thereby avoiding damage of the processor caused by high temperature, while ensuring stable and reliable operation of the processor. Since two liquid cooling plates corresponding to the same motherboard are connected in series to form the liquid cooling loop, compared with the related art that a single liquid cooling plate forms a liquid cooling loop, there is no need to provide a separate communication loop for each liquid cooling plate in the liquid cooling device, which not only can effectively reduce a space occupied by pipelines of the liquid cooling device, but also can fully utilize cooling capacity of the coolant, so as to avoid resource waste while ensuring a heat dissipation effect. In addition, since each liquid cooling plate is attached to a surface of the corresponding heat generating element, when a space corresponding to the motherboard is relatively narrow due to the stacked arrangement of the plurality of motherboards, the plurality of liquid cooling plates in the liquid cooling device can still effectively dissipate heat from the plurality of heat generating elements forming an upper-lower layer structure by using the coolant flowing in the liquid cooling plates. Therefore, compared with the conventional air cooling device, the liquid cooling device can effectively dissipate heat from the plurality of heat generating elements at the same time under a condition of limited space, thereby avoiding the influence of continuous high temperature from affecting the stability and reliability of the processor during operation.

In one of the embodiments, the liquid cooling device further includes at least two series pipes and a plurality of branch pipes, each liquid cooling plate is provided with a water inlet and a water outlet, the water inlet of one liquid cooling plates is in communication with the water outlet of another liquid cooling plate through one series pipe, and the water inlet of the one liquid cooling plate and the water outlet of the another liquid cooling plate are both in communication with the branch pipe.

In one of the embodiments, the liquid cooling device further includes a plurality of first connecting joints in communication with the water outlets, the water inlets, the series pipes, and the branch pipes.

In one of the embodiments, each first connecting joint includes a first connecting portion, a first fixing portion, and a first pagoda portion that are sequentially connected, the first connecting portion is in communication with the corresponding water outlet or water inlet, an outer periphery of the first pagoda portion is provided with at least two conical protrusion structures, the first pagoda portion is in communication with the corresponding series pipe or branch pipe, and the first fixing portion is threadedly connected to a nut, so as to fix the first pagoda portion to the corresponding series pipe or branch pipe.

In one of the embodiments, the plurality of liquid cooling plates includes a first liquid cooling plate, a second liquid cooling plate, a third liquid cooling plate, and a fourth liquid cooling plate, the first liquid cooling plate and the second liquid cooling plate are respectively attached to two corresponding heat generating elements located on the same motherboard, the third liquid cooling plate and the fourth liquid cooling plate are respectively attached to two corresponding heat generating elements located on another motherboard, the first liquid cooling plate and the second liquid cooling plate are connected in series to form a first liquid cooling loop, the third liquid cooling plate and the fourth liquid cooling plate are connected in series to form a second liquid cooling loop, and the first liquid cooling loop and the second liquid cooling loop are connected in parallel.

In one of the embodiments, the liquid cooling device further includes a liquid distributor, a liquid supply pipe, and a liquid return pipe, the two branch pipes of the first liquid cooling loop and the two branch pipes of the second liquid cooling loop are in communication with the liquid distributor, and the liquid distributor is provided with a liquid entering port in communication with the liquid supply pipe and a liquid return port in communication with the liquid return pipe.

In one of the embodiments, the liquid distributor is provided with a first liquid outlet, a second liquid outlet, a first liquid inlet, and a second liquid inlet, the liquid distributor includes a first quick-connecting male joint located at the first liquid outlet and a second quick-connecting male joint located at the first liquid inlet, the branch pipe in the first liquid cooling loop in communication with the water inlet is provided with a first quick-connecting female joint, the first quick-connecting female joint is in communication with the first quick-connecting male joint, the branch pipe in the first liquid cooling loop in communication with the water outlet is provided with a second quick-connecting female joint, the second quick-connecting female joint is in communication with the second quick-connecting male joint, the liquid distributor further includes a plurality of second connecting joints located at the second liquid outlet and the second liquid inlet, and two second connecting joints are in communication with the two branch pipes in the second liquid cooling loop in a one-to-one correspondence.

In one of the embodiments, each second connecting joint includes a second connecting portion, a second fixing portion, and a second pagoda portion that are sequentially connected, the second liquid outlet and the second liquid inlet are each in communication with the corresponding second connecting portion, an outer periphery of the second pagoda portion is provided with at least two conical protrusion structures, the second pagoda portion is in communication with the corresponding branch pipe, and the second fixing portion is threadedly connected to a nut, so as to fix the second pagoda portion to the corresponding branch pipe.

In one of the embodiments, an end of the liquid supply pipe away from the liquid distributor is provided with a third quick-connecting male joint, an end of the liquid return pipe away from the liquid distributor is provided with a fourth quick-connecting male joint.

In one of the embodiments, the liquid cooling device further includes a plurality of fixing members configured to fix the liquid cooling plates to the corresponding motherboards.

According to a second aspect, a server is further provided, including the aforementioned liquid cooling device.

In one of the embodiments, the server further includes a housing assembly provided with a cavity, the liquid cooling device is received in the cavity, and the at least two motherboards are connected to the housing assembly.

According to the server, since the plurality of motherboards are stacked, the plurality of heat generating elements provided on the plurality of motherboards can form an upper-lower layer structure, so that the space occupied by the plurality of motherboards can be reduced, thereby facilitating the miniaturization of the server. Since each liquid cooling plate is attached to the corresponding heat generating element, and two liquid cooling plates corresponding two heat generating elements on the same motherboard are connected in series to form the liquid cooling loop. Therefore, when coolant flows into the liquid cooling loop, the coolant flowing in the liquid cooling plate can dissipate heat from the corresponding heat generating element in time, so that the liquid cooling device can effectively dissipate heat from the plurality of heat generating elements at the same time, thereby avoiding damage of the processor caused by high temperature and ensuring stable and reliable operation of the processor. Since each liquid cooling plate is attached to the corresponding heat generating element, the liquid cooling device can adapt to the situation that the space corresponding to the motherboard is relatively narrow when the plurality of motherboards are stacked and the plurality of heat generating elements form the upper-lower layer structure, thereby avoiding the problem of ineffective heat dissipation due to insufficient space and ensuring the stability and reliability of the server during operation.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

The drawings constitute a part of the present disclosure and are used to provide a further understanding of the present disclosure. The exemplary embodiments of the present disclosure and their descriptions are used to explain the present disclosure and do not constitute an improper limitation of the present disclosure.

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

Additionally, the figures are not shown in a scale of 1:1, and the relative dimensions of the various elements are illustrated in the figures by way of example, and not necessarily to a true scale.

Figure 1:
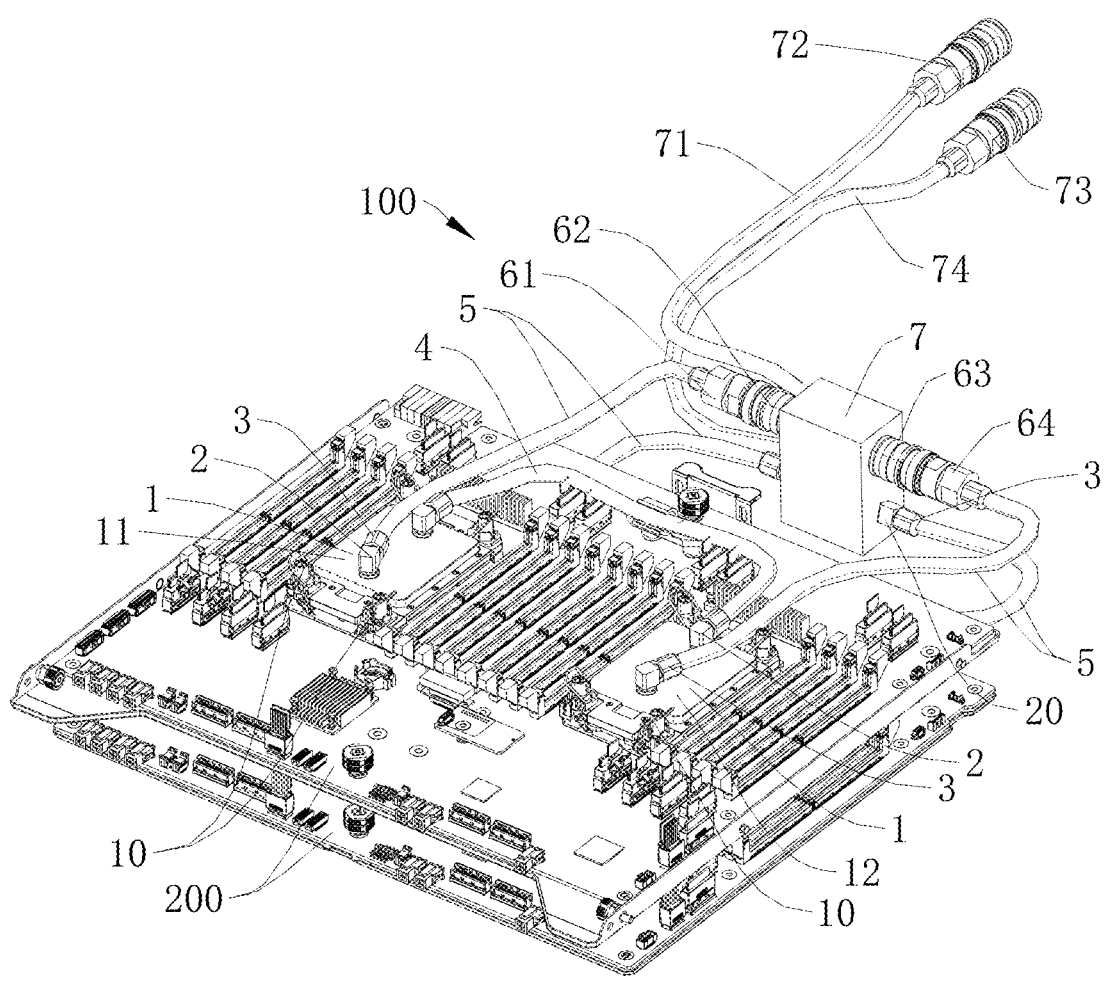

FIG. 1 is a perspective view of a liquid cooling device according to an embodiment of the present disclosure.

Figure 2:
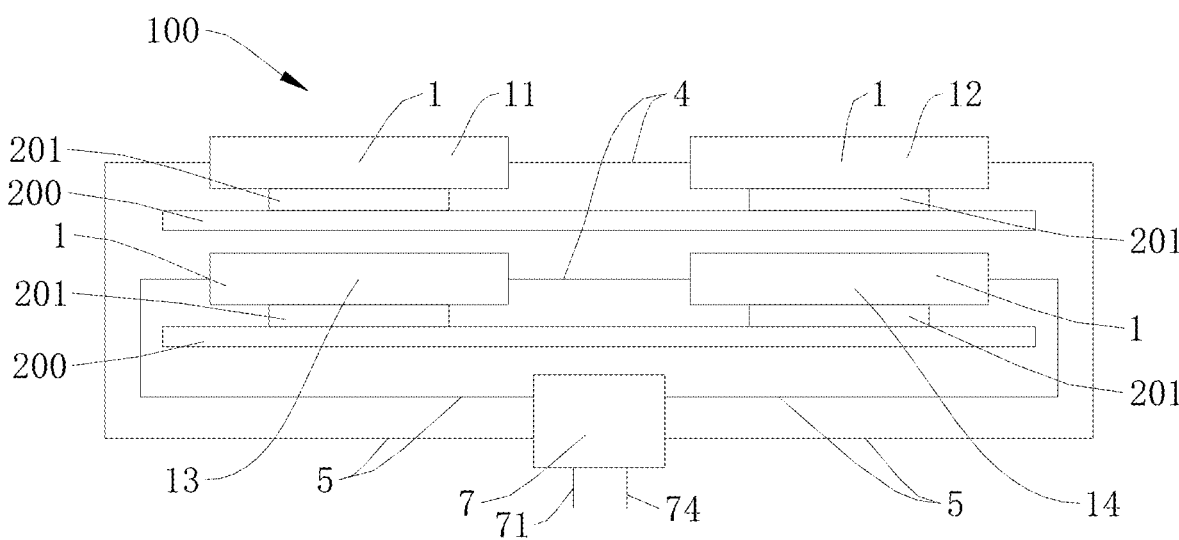

FIG. 2 is a block diagram of a liquid cooling device according to an embodiment of the present disclosure.

Figure 3:
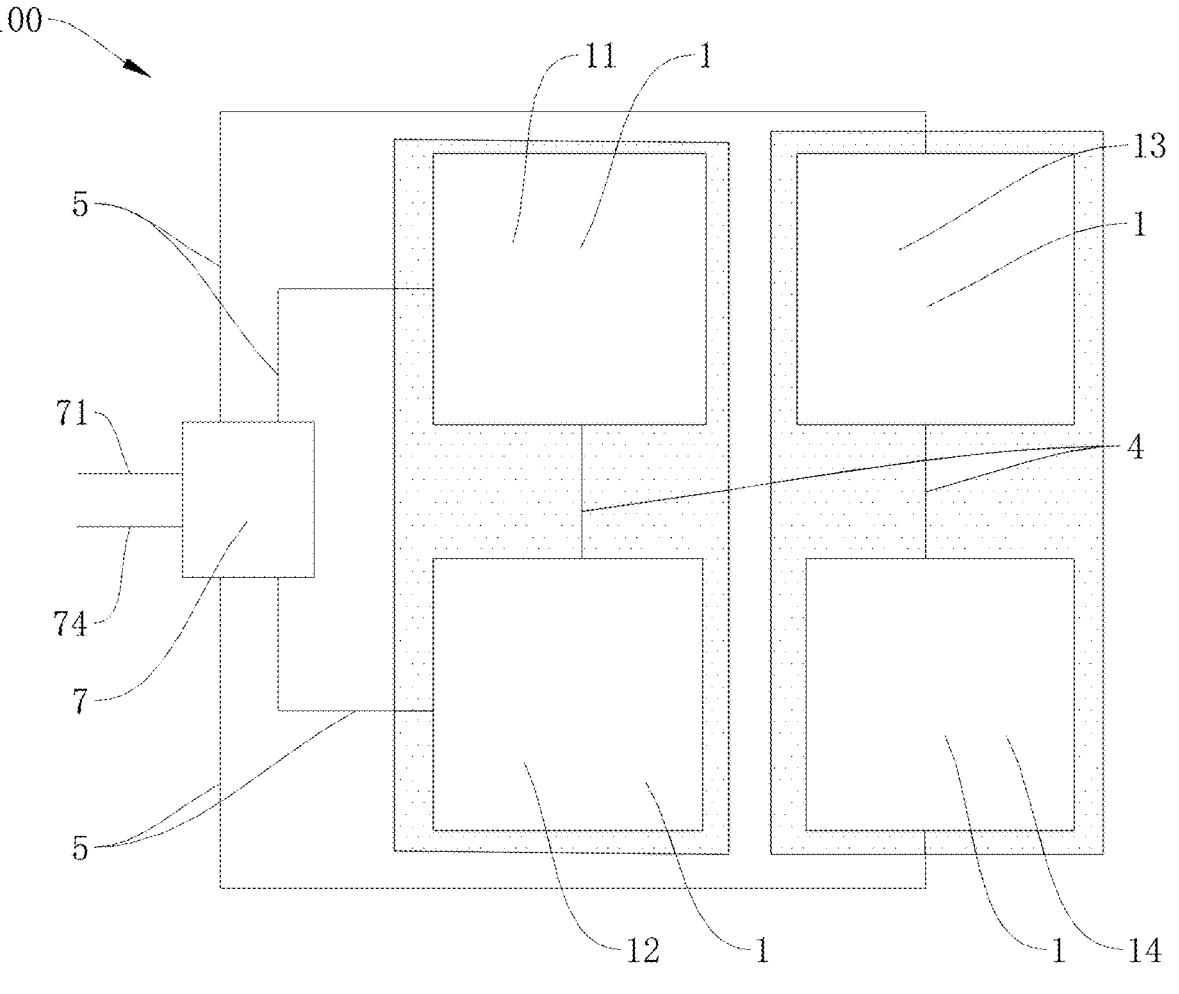

FIG. 3 is a block diagram of a liquid cooling loop according to an embodiment of the present disclosure.

Figure 4:
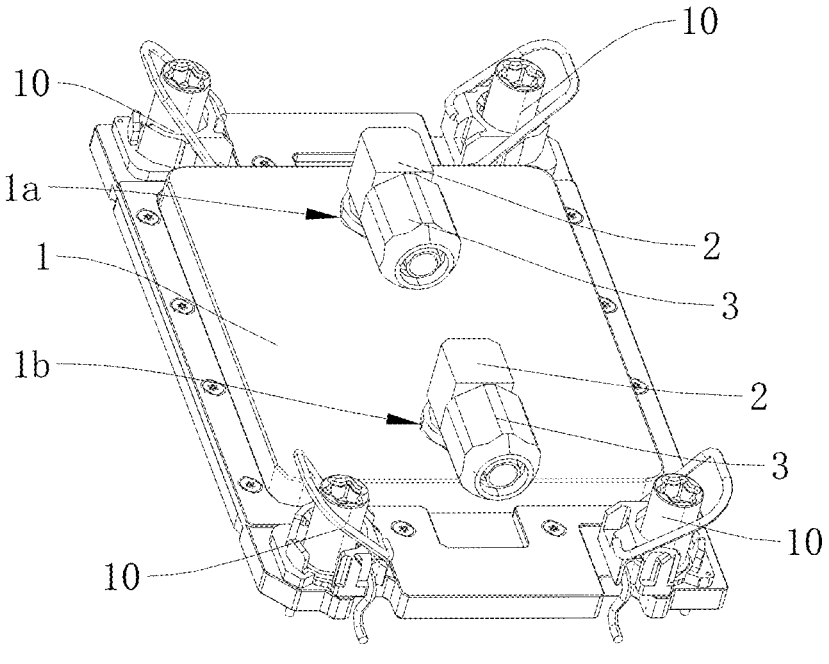

FIG. 4 is a perspective view of a liquid cooling plate according to an embodiment of the present disclosure.

Figure 5:
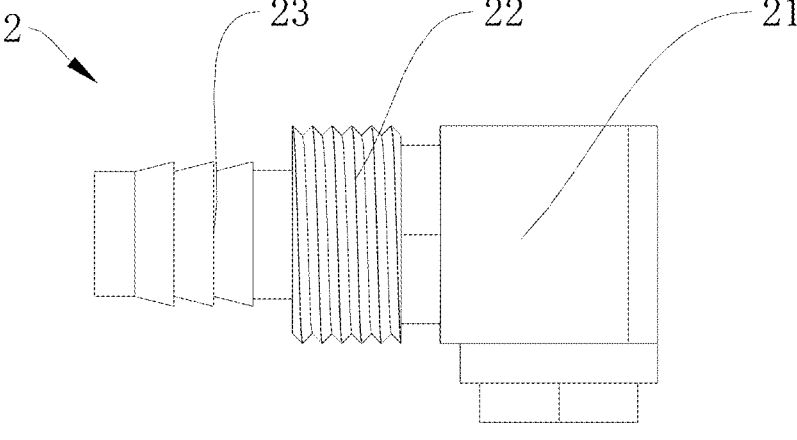

FIG. 5 is a side view of a first connecting joint of FIG. 4.

DESCRIPTION OF REFERENCE SIGNS

100. Liquid cooling device; 200. Motherboard; 201. Heat generating element; 10. Fixing member; 1. Liquid cooling plate; la. Water inlet; 1*b*. Water outlet; 11. First liquid cooling plate; 12. Second liquid cooling plate; 13. Third liquid cooling plate; 14. Fourth liquid cooling plate; 20. Second connecting joint; 2. First connecting joint; 21. First connecting portion; 22. First fixing portion; 23. First pagoda portion; 4. Series pipe; 5. Branch pipe; 61. First quick-connecting female joint; 62. First quick-connecting male joint; 63. Second quick-connecting male joint; 64 Second quick-connecting female joint; 7. Liquid distributor; 71. Liquid supply pipe; 72. Third quick-connecting male joint; 73. Fourth quick-connecting male joint; 74. Liquid return pipe.

DETAILED DESCRIPTION OF THE EMBODIMENTS

In order to make the above objects, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential direction" are based on the azimuth or position relationship shown in the attached drawings, which are only for the convenience of describing the present disclosure and simplifying the description, rather than indicating or implying that the device or element must have a specific azimuth, be constructed and operated in a specific azimuth, so such terms cannot be understood as a limitation of the present disclosure.

In addition, the terms "first" and "second" are only used for descriptive purposes and cannot be understood as indicating or implying relative importance or implicitly indicating the number of indicated technical features. Thus, the features defined with "first" and "second" may explicitly or implicitly include at least one of the features. In the description of the present disclosure, "a plurality of" means at least two, such as two, three, etc., unless otherwise expressly and specifically defined.

In the present disclosure, unless otherwise expressly specified and limited, the terms "mount", "connect", "contact", "fix" and other terms should be understood in a broad sense, for example, they can be fixed connections, detachable connections, or integrated. They can be mechanical connection or electrical connection. They can be directly connected or indirectly connected through an intermediate medium. They can be the connection within two elements or the interaction relationship between two elements, unless otherwise expressly limited. For those skilled in the art, the specific meaning of the above terms in the present disclosure can be understood according to the specific situation.

In the present disclosure, unless otherwise expressly specified and limited, the first feature "above" or "below" the second feature may be in direct contact with the first and second features, or the first and second features may be in indirect contact through an intermediate medium. Moreover, the first feature is "above" the second feature, but the first feature is directly above or diagonally above the second feature, or it only means that the horizontal height of the first feature is higher than the second feature. The first feature is "below" of the second feature, which can mean that the first feature is directly below or obliquely below the second feature, or simply that the horizontal height of the first feature is less than that of the second feature.

It should be noted that when an element is called "fixed to" or "provided on" another element, it can be directly on another element or there can be a centered element. When an element is considered to be "connected" to another element, it can be directly connected to another element or there may be intermediate elements at the same time. The terms "vertical", "horizontal", "up", "down", "left", "right" and similar expressions used herein are for the purpose of illustration only and do not represent the only embodiment.

Referring to FIGS. 1 to 3, a liquid cooling device 100 is provided according to an embodiment of the present disclosure. The liquid cooling device 100 includes at least two motherboards 200 and a plurality of liquid cooling plates 1. The at least two motherboards 200 are stacked, and each motherboard 200 is provided with at least two heat generating elements 201. The plurality of liquid cooling plates 1 are attached to the plurality of heat generating elements 201 in a one-to-one correspondence. Two liquid cooling plates 1 corresponding to two heat generating elements 201 on the same motherboard 200 are connected in series to form a liquid cooling loop, and a plurality of liquid cooling loops are connected in parallel.

According to the aforementioned liquid cooling device 100, at least two motherboards 200 are stacked, at least two heat generating elements 201 are provided on each motherboard 200, the plurality of liquid cooling plates 1 are attached to the plurality of heat generating elements 201 in a one-to-one correspondence, and two liquid cooling plates 1 corresponding to two heat generating elements 201 on the same motherboard 200 are connected in series to form the liquid cooling loop. Therefore, when coolant is supplied into the liquid cooling loop, the coolant flowing in the liquid cooling plate 1 can dissipate heat from the corresponding heat generating element 201 in time, so that the liquid cooling device 100 can effectively dissipate heat from the plurality of heat generating elements 201 at the same time, thereby avoiding damage of the motherboard 200 caused by high temperature, while ensuring stable and reliable operation of the motherboard 200. Since two liquid cooling plates 1 corresponding to the same motherboard 200 are connected in series to form the liquid cooling loop, compared with the related art that a single liquid cooling plate 1 forms a liquid cooling loop, there is no need to provide a separate communication loop for each liquid cooling plate 1 in the liquid cooling device 100, which not only can effectively reduce a space occupied by pipelines of the liquid cooling device 100, but also can fully utilize cooling capacity of the coolant, so as to avoid resource waste while ensuring a heat dissipation effect. In addition, since each liquid cooling plate 1 is attached to a surface of the corresponding heat generating element 201, when a space corresponding to the motherboard 200 is relatively narrow due to the stacked arrangement of the plurality of motherboards 200, the plurality of liquid cooling plates 1 in the liquid cooling device 100 can still effectively dissipate heat from the plurality of heat generating elements 201 forming an upper-lower layer structure by using the coolant flowing in the liquid cooling plates 1. Therefore, compared with the conventional air cooling device, the liquid cooling device 100 can effectively dissipate heat from the plurality of heat generating elements 201 at the same time under a condition of limited space, thereby avoiding the influence of continuous high temperature from affecting the stability and reliability of the motherboard 200 during operation.

The heat generating element 201 includes, but is not limited to, a central processing unit (CPU), a graphics processing unit (GPU), etc.

The number of the motherboards 200 may be configured as required, for example, two, three, four, or more. The number of the heat generating elements 201 provided on each motherboard 200 may be the same or different, as long as each motherboard 200 can correspond to 2N (N is greater than or equal to 1) of liquid cooling plates 1, so as to ensure that each liquid cooling plate 1 can be connected in series with another liquid cooling plate 1 attached to corresponding the corresponding heat generating element 201 of the same motherboard 200 to form the liquid cooling loop. For example, each motherboard 200 corresponds to two liquid cooling plates 1. Alternatively, a first motherboard 200 corresponds to two liquid cooling plates 1, and a second motherboard 200 corresponds to four liquid cooling plates 1.

Further, in an embodiment, referring to FIGS. 1 to 4, the liquid cooling device 100 further includes at least two series pipes 4 and a plurality of branch pipes 5. Each liquid cooling plate 1 is provided with a water inlet 1*a* and a water outlet 1*b*. In one liquid cooling loop, the water inlet 1*a* of one first liquid cooling plate 1 is in communication with the water outlet 1*b* of the other liquid cooling plate 1 through one series pipe 4, and the water inlet 1*a* of the one liquid cooling plate 1 and the water outlet 1*b* of the other liquid cooling plate 1 are in communication with two branch pipes 5, respectively. In this way, when the coolant flows into the liquid cooling loop, the coolant can flow into the one liquid cooling plate 1 from the water inlet 1*a* and flow out of the other liquid cooling plate 1 from the water outlet 1*b*, so that the coolant can absorb the heat from the heat generating element 201 corresponding to the liquid cooling plate 1 in time to cool the heat generating element 201.

Further, in an embodiment, referring to FIG. 1 and FIG. 4, the liquid cooling device 100 further includes a plurality of first connecting joints 2 in communication with a plurality of water ports and a plurality of communication pipes. The plurality of water ports include the water outlets 1*b* and the water inlets 1*a*, and the plurality of communication pipes include the series pipes 4 and the branch pipes 5.

Referring to FIG. 5, each first connecting joint 2 includes a first connecting portion 21, a first fixing portion 22, and a first pagoda portion 23 that are sequentially connected. The first connecting portion 21 is in communication with the corresponding water port. An outer periphery of the first pagoda portion 23 is provided with at least two conical protrusion structures. The first pagoda portion 23 is in communication with the corresponding communication pipe. The first fixing portion 22 is configured to be threadedly connected to a nut, so as to fix the first pagoda portion 23 to the corresponding communication pipe. In this way, when the communication pipe and the first connecting joint 2 are connected, it is only necessary to rotate the nut to ensure that the water port can be reliably in communication with the corresponding communication pipe, thereby ensuring that the liquid cooling device 100 can effectively dissipate heat from the plurality of heat generating elements 201 at the same time when the coolant flows into the liquid cooling device 100.

Since each communication pipe in the liquid cooling device 100 is connected to the corresponding water port through the first connecting joint 2 with the same structure, compared with the design of using a quick connecting joint to connect the liquid cooling plate 1 and the corresponding communication pipe, such design can not only effectively save the cost, but also effectively save a space occupied by internal connection nodes of the liquid cooling device 100, so that the structure of the liquid cooling device 100 is more compact. In addition, the at least two stacked conical protrusion structures of the first pagoda portion 23 can effectively ensure that when the first pagoda portion 23 is in communication with the communication pipe, a joint area between the communication pipe and the first connecting joint 2 is larger and a bearing capacity is stronger. Therefore, the communication pipe is not easy to be separated from the first pagoda portion 23 under the action of repeated load, so that the sealing performance between the first connecting joint 2 and the communication pipe can be effectively ensured, and a connection portion between the first connecting joint 2 and the communication pipe can withstand a certain liquid pressure to avoid leakage.

The number of the conical protrusion structures in the first pagoda portion 23 may be provided as required, for example, two, three or more, and the plurality of conical protrusion structures are arranged along an extending direction of the first pagoda portion 23.

In an embodiment, referring to FIGS. 1 to 3, the plurality of liquid cooling plates 1 include a first liquid cooling plate, a second liquid cooling plate, a third liquid cooling plate, and a fourth liquid cooling plate. The first liquid cooling plate and the second liquid cooling plate are respectively attached to two corresponding heat generating elements 201 located on the same motherboard 200. The third liquid cooling plate and the fourth liquid cooling plate are respectively attached to two corresponding heat generating elements 201 located on the other motherboard 200. The first liquid cooling plate and the second liquid cooling plate are connected in series to form a first liquid cooling loop, the third liquid cooling plate and the fourth liquid cooling plate are connected in series to form a second liquid cooling loop, and the first liquid cooling loop and the second liquid cooling loop are connected in parallel. In this way, when the coolant flows into the first liquid cooling loop and the second liquid cooling loop, the first liquid cooling plate, the second liquid cooling plate, the third liquid cooling plate, and the fourth liquid cooling plate can dissipate the heat from the corresponding heat generating elements 201 in time, so as to cool the four heat generating elements 201 at the same time. Since the four liquid cooling plates are connected in series in pairs to form the liquid cooling loop, compared with the related art that a single liquid cooling plate 1 forms a liquid cooling loop, there is no need to provide a separate communication loop for each liquid cooling plate 1 in the liquid cooling device 100, which not only can effectively reduce the space occupied by the pipelines in the liquid cooling device 100, but also can fully utilize the cooling capacity of the coolant, so as to avoid resource waste while ensuring the heat dissipation effect.

In order to better explain that when the coolant flows into the two liquid cooling plates 1 connected in series, not only the cooling capacity of the coolant can be fully utilized, but also the heat dissipation effect on each heat generating element 201 can be ensured, taking the heat generating element 201 as a CPU as an example in the following. Heat dissipation model simulation data are compared between the liquid cooling loop formed by a single liquid cooling plate 1 and the liquid cooling loop formed by two liquid cooling plates 1 connected in series.

Basic data for performing the model simulation includes: a total CPU power consumption of 350 W, a maximum CPU surface temperature (Tcase max) of 55° C., a CPU core (CPU die) power of 350 W, a CPU core (Core die) size of 23.26×20.58, a CPU core (Core die) heat flux density of 18.27 W/cm2, a CPU surface temperature (CPU Tcase) of 49.2° C., and a fluid temperature rise of 1 LPM@40° C. of 4.97° C.

According to the above basic data, the liquid cooling loop composed of a single liquid cooling plate 1 is used to simulate the heat dissipation on a single CPU, and the change of CPU temperature with coolant flow rate is shown in the following table:

| | Coolant flow rate (LPM) | | | | | | | | | |
|---|------|------|------|------|------|------|------|------|------|------|
| | 0.5 | 0.8 | 1.0 | 1.2 | 1.4 | 1.6 | 1.8 | 2.0 | 3.0 | 4.0 |
| Tcase (° C.) | 54.0 | 50.4 | 49.2 | 48.4 | 47.8 | 47.4 | 47.1 | 46.8 | 46.1 | 45.7 |

It can be seen from the above table that the temperature of the CPU decreases as the coolant flow rate increases, and it can be seen from a specification that a temperature specification (Tcase spec) of the surface of the CPU under this working condition is 65° C. It can be seen from the above data that the temperature (Tcase) of the surface of the CPU is less than the temperature specification (Tcase spec) of the surface of the CPU, so that the temperature margin of the coolant is sufficient when the coolant flows into the liquid cooling loop to cool the CPU. Based on this, when the liquid cooling loop composed of a single liquid cooling plate 1 is used to dissipate heat from single CPU, it has a good heat dissipation effect.

According to the above basic data and temperature theoretical calculation, the liquid cooling loop formed by two liquid cooling plates 1 connected in series is used to simulate the synchronous heat dissipation on two CPUs, and a temperature of an upstream liquid cooling plate 1 and a temperature of a downstream liquid cooling plate 1 in the liquid cooling loop are shown in the following table:

| Coolant flow rate | Temperature (Tcase) of the surface of the upstream liquid cooling plate | Temperature difference ΔT of the liquid cooling plate | Temperature (Tcase) of the surface of the downstream liquid cooling plate |
|---|---|---|---|
| 0.8 LPM | 50.4° C. | 6.3° C. | 56.7° C. |
| 1.0 LPM | 49.2° C. | 5.0° C. | 54.2° C. |
| 1.2 LPM | 48.4° C. | 4.2° C. | 52.6° C. |
| 1.4 LPM | 47.8° C. | 3.6° C. | 51.4° C. |
| 1.6 LPM | 47.4° C. | 3.1° C. | 50.5° C. |
| 1.8 LPM | 47.1° C. | 2.8° C. | 49.9° C. |
| 2.0 LPM | 46.8° C. | 2.5° C. | 49.3° C. |

It can be seen from the above table that, compared with the design solution in which a single liquid cooling loop formed by a single liquid cooling plate 1 cools a single CPU, the design solution in which two liquid cooling plates 1 are connected in series to form the liquid cooling loop for synchronous heat dissipation on two CPUs, the temperatures of the two liquid cooling plates 1 in the series loop will also gradually decrease as the coolant flow rate increases, and the temperature difference between the upstream liquid cooling plate 1 and the downstream liquid cooling plate 1 is gradually decrease as the coolant flow rate increases. In addition, when the temperature specification (Tcase spec) of the surface of the CPU is 65° C., it can be seen from the above data that the temperature (Tcase) of the surface of the upstream cooling plate and the temperature (Tcase) of the surface of the downstream liquid cooling plate are both less than the temperature specification (Tease spec) of the surface of the CPU. The temperature of the surface of the liquid cooling plate is the same as the temperature of the surface of the CPU. Therefore, when the two liquid cooling plates 1 are connected in series to form the liquid cooling loop for simultaneously dissipating heat from the two heat generating elements 201, the liquid cooling loop can not only ensure a better heat dissipation effect, but also ensure more uniform heat dissipation between the liquid cooling plates 1. Based on this, it can be seen that the design in which the two liquid cooling plates 1 are connected in series to simultaneously cool the two heat generating elements 201 can more fully utilize the cooling capacity of the coolant, which is beneficial to avoiding the waste of resources.

A theoretical calculation formula of temperature includes an energy formula $Q=cm\Delta T$, a volume flow formula $q_v=V/t=m/\rho t$, and a liquid cooling plate temperature difference formula $\Delta T=P/\rho q_v c=0.0143\ P/q_v$. In the energy formula, Q is heat and its unit is J, C is specific heat capacity and its unit is J/kg·° C., m is a mass and its unit is kg, $\Delta T$ is a temperature difference and its unit is ° C. In the volume flow formula, $q_v$ is a coolant volume flow rate and its unit is $m^3/s$, m is a mass and its unit is kg, $\rho$ is a coolant density and its unit is $kg/m^3$, t is a time and its unit is s. In the liquid cooling plate temperature difference formula, P is a CPU power consumption and its unit is W.

In an embodiment, referring to FIG. 1 to FIG. 3, the liquid cooling device 100 further includes a liquid distributor 7, a liquid supply pipe 71, and a liquid return pipe 74. The two branch pipes 5 of the first liquid cooling loop and the two branch pipes 5 of the second liquid cooling loop are in communication with the liquid distributor 7. The liquid distributor 7 is provided with a liquid entering port and a liquid return port, the liquid supply pipe 71 is in communication with the liquid entering port, and the liquid return pipe 74 is in communication with the liquid return port. The liquid supply pipe 71 and the liquid return pipe 74 are configured to be connected to a liquid cooling distribution assembly (not shown). In this way, when the liquid cooling distribution assembly delivers the coolant to the liquid distributor 7 through the liquid supply pipe 71, the liquid distributor 7 can distribute the coolant to each liquid cooling loop, so that each liquid cooling loop has the coolant flowing therein, so as to cool the plurality of heat generating elements 201 at the same time, thereby ensuring the cooling effect of the liquid cooling device 100, and avoiding the continuous high temperature from affecting the stability and the reliability of the operation of the motherboard 200. The high-temperature coolant flowing out from each liquid cooling loop can flow back to the liquid cooling distribution assembly through the liquid distributor 7 and the liquid return pipe 74, thereby completing a flow circulation of the coolant.

Further, in an embodiment, referring to FIG. 1, the liquid distributor 7 is provided with a first liquid outlet, a second liquid outlet, a first liquid inlet, and a second liquid inlet. The liquid distributor 7 includes a first quick-connecting male joint 62 located at the first liquid outlet and a second quick-connecting male joint 63 located at the first liquid inlet. The branch pipe 5 in the first liquid cooling loop in communication with the water inlet 1a is provided with a first quick-connecting female joint 61, and the first quick-connecting female joint 61 is in communication with the first quick-connecting male joint 62. The branch pipe 4 in the first liquid cooling loop in communication with the water outlet 1b is provided with a second quick-connecting female joint 64, and the second quick-connecting female joint 64 is in communication with the second quick-connecting male joint 63.

The liquid distributor 7 further includes two second connecting joints 20 located at the second liquid outlet and the second liquid inlet. The two second connecting joints 20 are in communication with the two branch pipes 5 in the second liquid cooling loop in a one-to-one correspondence. In an embodiment, the structure of the second connecting joint 20 is the same as that of the first connecting joint 2, and the structure of the second connecting joint 20 can be referred to FIG. 5. Each second connecting joint 20 includes a second connecting portion, a second fixing portion, and a second pagoda portion that are sequentially connected. The second liquid outlet and the second liquid inlet are each in communication with the corresponding second connecting portion. An outer periphery of the second pagoda portion is provided with at least two conical protrusion structures. The second pagoda portion is in communication with the corresponding branch pipe 5. The second fixing portion is threadedly connected to a nut, so as to fix the second pagoda portion to the corresponding branch pipe 5. In this way, it can be ensured that the liquid distributor 7 can simultaneously supply the coolant to the first liquid cooling loop and the second liquid cooling loop, so that the liquid cooling device 100 can dissipate heat from the four heat generating elements 201 at the same time.

In addition, since the first liquid cooling loop is connected to the liquid distributor 7 through the quick connecting joint, it is convenient to disassemble and assemble the first liquid cooling loop and the liquid distributor 7, so that when the motherboard 200 corresponding to the first liquid cooling loop is located above the motherboard 200 corresponding to the second liquid cooling loop, and the motherboard 200 corresponding to the first liquid cooling loop can be rotatable around a fixing end thereof, the motherboard 200 corresponding to the second liquid cooling loop can be operated and maintained by disassembling the first liquid cooling loop from the liquid distributor 7 and rotating the motherboard 200 corresponding to the first liquid cooling loop, so that the whole structure is convenient to operate and maintain.

Furthermore, since the second liquid cooling loop is connected to the liquid distributor 7 through the second connecting joint 20, compared with the related art that the first liquid cooling loop and the second liquid cooling loop are connected to the branch pipe 5 through quick connecting joints, a pair of quick connecting joints can be omitted, which not only can save the cost effectively, but also can save the space occupied by the liquid cooling device 100 effectively, thereby ensuring the miniaturization of the device.

The at least two conical protrusion structures of the second pagoda portion can effectively ensure the sealing performance between the second connecting joint 20 and the branch pipe 5 when the second connecting joint 20 is in communication with the branch pipe 5, so that a connection portion between the second connecting joint 20 and the branch pipe 5 can withstand a certain liquid pressure to avoid leakage. The number of the conical protrusion structures in the second pagoda portion may be provided as required, for example, two, three or more, and the plurality of conical protrusion structures are arranged along the extending direction of the second pagoda portion.

The positions of the first liquid outlet, the second liquid outlet, the first liquid inlet, and the second liquid inlet in the liquid distributor 7 can be configured as required. For example, referring to FIG. 1, the first and second liquid inlets can be arranged on the same side of the liquid distributor 7, and the first and second liquid outlets can be arranged on the other side of the liquid distributor 7, so that when the liquid distributor 7 is in communication with the liquid cooling loop, the first and second liquid inlets and the first and second liquid outlets can be conveniently distinguished, which is beneficial to improving the assembly efficiency. Alternatively, the first and second liquid inlets can be arranged around a circumference of the liquid distributor 7, and the first and second liquid outlets are arranged on a side of the first and second liquid inlets in a one-to-one correspondence. In this way, when the liquid distributor 7 is connected to the liquid cooling loop, the branch pipe for liquid inlet in the liquid cooling loop can be in communication with the first and second liquid outlets, the branch pipe for liquid outlet can be in communication with the first and second liquid inlets, so that the positions of the branch pipe for liquid inlet and the branch pipe for liquid outlet in the same liquid cooling branch can be conveniently found.

In an embodiment, referring to FIG. 1, an end of the liquid supply pipe 71 away from the liquid distributor 7 is provided with a third quick-connecting male joint 72, and the third quick-connecting male joint 72 is configured to be in communication with a third quick-connecting female joint of the liquid cooling distribution assembly. An end of the liquid return pipe 74 away from the liquid distributor 7 is provided with a fourth quick-connecting male joint 73, and the fourth quick-connecting male joint 73 is configured to be in communication with a fourth quick-connecting female joint in the liquid cooling distribution assembly. In this way, the liquid distributor 7 can be quickly connected to the liquid cooling distribution assembly through the third quick-connecting male joint 72 and the fourth quick-connecting male joint 73, which is beneficial to improving the efficiency of the assembly process and facilitating the disassembly and maintenance of the liquid cooling device 100 and the external structure.

In other embodiments, the liquid supply pipe 71 and the liquid return pipe 74 may also be connected to the liquid cooling distribution assembly through the second connecting joint 20.

In an embodiment, referring to FIGS. 1 and 4, the liquid cooling device 100 includes a plurality of fixing members 10 configured to fix the liquid cooling plates 1 to the corresponding motherboards 200. In this way, each liquid cooling plate 1 can be reliably fixed on the corresponding motherboard 200, thus ensuring each liquid cooling plate 1 is attached to the corresponding heat generating element 201, so that the coolant flowing through the liquid cooling plate 1 can absorb the heat from the corresponding heat generating element 201 in time, and it is ensured that the liquid cooling plate 1 can reliably cool the corresponding heat generating element 201 to achieve the heat dissipation effect.

In an embodiment, the fixing member 10 is detachably connected to the motherboard 200. The fixing member 10 may be a bolt, a screw, etc.

Referring to FIG. 1 and FIG. 2, a server is further provided according to an embodiment, which includes the liquid cooling device 100 of any one of the above embodiments.

Further, in an embodiment, the server includes a housing assembly provided with a cavity. The liquid cooling device 100 is received in the cavity, and the at least two motherboards 200 are connected to the housing assembly. In this way, the housing assembly can effectively protect the components in the housing assembly, thereby ensuring the reliability among the components in the server.

In an embodiment, the server further includes a liquid cooling distribution assembly in communication with each of the liquid cooling loops. The liquid cooling distribution assembly is configured to deliver coolant to the plurality of liquid cooling loops and to collect coolant flowing out of the plurality of liquid cooling loops. In this way, the liquid cooling distribution assembly and the liquid cooling device 100 cooperatively form a circulation system of the coolant, so that the coolant can circulate in the liquid cooling device 100 to effectively dissipate heat from each heat generating element 201 in the server, thereby ensuring the reliability and stability of the operation of the motherboard 200 in the server.

According to the server, since the plurality of motherboards 200 are stacked, the plurality of heat generating elements 201 provided on the plurality of motherboards 200 can form an upper-lower layer structure, so that the space occupied by the plurality of motherboards 200 can be reduced, thereby facilitating the miniaturization of the server. Since each liquid cooling plate 1 is attached to the corresponding heat generating element 201, and two liquid cooling plates 1 corresponding two heat generating elements 201 on the same motherboard 200 are connected in series to form the liquid cooling loop. Therefore, when coolant flows into the liquid cooling loop, the coolant flowing in the liquid cooling plate 1 can dissipate heat from the corresponding heat generating element 201 in time, so that the liquid cooling device 100 can effectively dissipate heat from the plurality of heat generating elements 201 at the same time, thereby avoiding damage of the motherboard 200 caused by high temperature and ensuring stable and reliable operation of the motherboard 200. Since each liquid cooling plate 1 is attached to the corresponding heat generating element 201, the liquid cooling device 100 can adapt to the situation that the space corresponding to the motherboard 200 is relatively narrow when the plurality of motherboards 200 are stacked and the plurality of heat generating elements 201 form the upper-lower layer structure, thereby avoiding the problem of ineffective heat dissipation due to insufficient space and ensuring the stability and reliability of the server during operation.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A liquid cooling device, comprising:
   at least two motherboards that are stacked, and each of the motherboards being provided with at least two heat generating elements; and
   a plurality of liquid cooling plates attached to each of the heat generating elements are in a one-to-one correspondence, wherein two of the liquid cooling plates corresponding to two of the heat generating elements on a same one of the motherboards are connected in series to form a respective one of a plurality of liquid cooling loops, and the plurality of liquid cooling loops are connected in parallel; and
   a liquid distributor comprises a first liquid outlet, a second liquid outlet, a first liquid inlet, a second liquid inlet, a first quick-connecting male joint located at the first liquid outlet, a second quick-connecting male joint located at the first liquid inlet, and a plurality of second connecting joints located at the second liquid outlet and the second liquid inlet, respectively, each of the second connecting joints having a second pagoda portion,
   wherein the first liquid cooling loop is provided with a first quick-connecting female joint and a second quick-connecting female joint, the first quick-connecting female joint is in communication with the first quick-connecting male joint, the second quick-connecting female joint is in communication with the second quick-connecting male joint, and each second pagoda portion of the second connecting joints are in communication with the second liquid cooling loop.

2. The liquid cooling device according to claim 1, further comprising at least two series pipes and a plurality of branch pipes, wherein each of the liquid cooling plates is provided with a water inlet and a water outlet, the water inlet of one of the liquid cooling plates is in communication with the water outlet of another of the liquid cooling plates through one of the at least two series pipes, and the water inlet of the one liquid cooling plate and the water outlet of the another of the liquid cooling plates are both in communication with two of the branch pipes, respectively.

3. The liquid cooling device according to claim 2, further comprising a plurality of first connecting joints in communication with the water outlets, the water inlets, the series pipes, and the branch pipes.

4. The liquid cooling device according to claim 3, wherein each of the first connecting joints comprises a first connecting portion, a first fixing portion, and a first pagoda portion that are sequentially connected, the first connecting portion is in communication with a corresponding one of the water outlet or a corresponding one of the water inlet, an outer periphery of the first pagoda portion is provided with at least two conical protrusion structures, the first pagoda portion is in communication with a corresponding one of the series pipes or a corresponding one of the branch pipes, and the first fixing portion is threadedly connected to a nut, so as to fix the first pagoda portion to the corresponding one of the series pipes or the corresponding one of the branch pipes.

5. The liquid cooling device according to claim 2, wherein the plurality of liquid cooling plates comprises a first liquid cooling plate, a second liquid cooling plate, a third liquid cooling plate, and a fourth liquid cooling plate, the first liquid cooling plate and the second liquid cooling plate are respectively attached to two corresponding ones of the heat generating elements located on one of the motherboards, the third liquid cooling plate and the fourth liquid cooling plate are respectively attached to two corresponding ones of the heat generating elements located on another of the at least two motherboards, the first liquid cooling plate and the second liquid cooling plate are connected in series to form a first liquid cooling loop of the liquid cooling loops, the third liquid cooling plate and the fourth liquid cooling plate are connected in series to form a second liquid cooling loop of the liquid cooling loops, and the first liquid cooling loop and the second liquid cooling loop are connected in parallel.

6. The liquid cooling device according to claim 5, further comprising a liquid supply pipe and a liquid return pipe, wherein the two of the branch pipes of the first liquid cooling loop and the two of the branch pipes of the second liquid cooling loop are in communication with the liquid distributor, and the liquid distributor is provided with a liquid entering port in communication with the liquid supply pipe and a liquid return port in communication with the liquid return pipe.

7. The liquid cooling device according to claim 6, wherein one of the two of the branch pipes in the first liquid cooling loop in communication with the water inlet of the another of the liquid cooling plates is provided with the first quick-connecting female joint, another of the two of the branch pipes in the first liquid cooling loop in communication with the water outlet of the one of the liquid cooling plates is provided with the second quick-connecting female joint, the plurality of second connecting joints located at the second liquid outlet and the second liquid inlet, respectively, and two of the second connecting joints are in communication with the two of the branch pipes in the second liquid cooling loop are in a one-to-one correspondence.

8. The liquid cooling device according to claim 7, wherein each of the second connecting joints comprises a second connecting portion, a second fixing portion, and the second pagoda portion that are sequentially connected, an outer periphery of the second pagoda portion is provided with at least two conical protrusion structures, the second pagoda portion is in communication with the one or the another of the two corresponding ones of the branch pipes in the second liquid cooling loop, and the second fixing portion is threadedly connected to a nut, so as to fix the second pagoda portion to the one or the another of the two corresponding ones of the branch pipes in the second liquid cooling loop.

9. The liquid cooling device according to claim 6, wherein an end of the liquid supply pipe away from the liquid distributor is provided with a third quick-connecting male joint, an end of the liquid return pipe away from the liquid distributor is provided with a fourth quick-connecting male joint.

10. The liquid cooling device according to claim 1, further comprising a plurality of fixing members configured to fix the liquid cooling plates to a corresponding one of the motherboards.

11. A server, comprising the liquid cooling device according to claim 1.

12. The server according to claim 11, further comprising a housing assembly provided with a cavity, wherein the liquid cooling device is received in the cavity, and the at least two motherboards are connected to the housing assembly.

* * * * *